(12) United States Patent
Kodama et al.

(10) Patent No.: US 7,998,642 B2
(45) Date of Patent: Aug. 16, 2011

(54) MASK PATTERN DATA CREATION METHOD AND MASK

(75) Inventors: Chikaaki Kodama, Kanagawa-ken (JP); Hirotaka Ichikawa, Kanagawa-ken (JP); Kazuyuki Masukawa, Kanagawa-ken (JP); Toshiya Kotani, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 96 days.

(21) Appl. No.: 12/478,479

(22) Filed: Jun. 4, 2009

(65) Prior Publication Data

US 2010/0021825 A1   Jan. 28, 2010

(30) Foreign Application Priority Data

Jun. 6, 2008 (JP) ................................. 2008-149370
May 26, 2009 (JP) ................................. 2009-126283

(51) Int. Cl.
*G03F 1/00* (2006.01)
(52) U.S. Cl. ........................................... 430/5; 430/394
(58) Field of Classification Search ............... 430/5, 394
See application file for complete search history.

(56) References Cited

U.S. PATENT DOCUMENTS 7,332,250 B2   2/2008   Misaka
2006/0040189 A1*  2/2006   Yang ................................. 430/5
2006/0246362 A1   11/2006  Yasuzato
2006/0281016 A1*  12/2006  O'Brien ........................... 430/5
2007/0026322 A1*  2/2007   Yang ................................. 430/5

FOREIGN PATENT DOCUMENTS

JP   2007-034207   2/2007
JP   2008-066586   3/2008

* cited by examiner

*Primary Examiner* — Mark F Huff
*Assistant Examiner* — Rashid Alam
(74) *Attorney, Agent, or Firm* — Finnegan, Henderson, Farabow, Garrett & Dunner, L.L.P.

(57) ABSTRACT

A mask pattern data creation method includes: determining whether or not a spacing of adjacent assist pattern feature data is not more than a prescribed spacing, based on: initial position data indicating an initially set position of the assist pattern feature data determined based on an illumination condition; and initial size data indicating an initially set size of the assist pattern feature data satisfying a size condition to not optically form an image on the transfer destination; and moving at least one of the adjacent assist pattern feature data or reducing a size of the at least one to increase the spacing of the assist pattern feature data to exceed a prescribed spacing in the case where it is determined that the spacing of the assist pattern feature data is not more than the prescribed spacing.

15 Claims, 14 Drawing Sheets

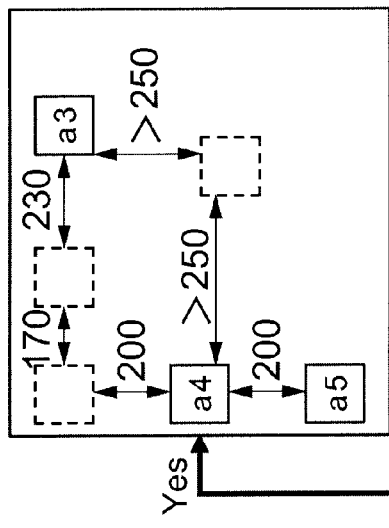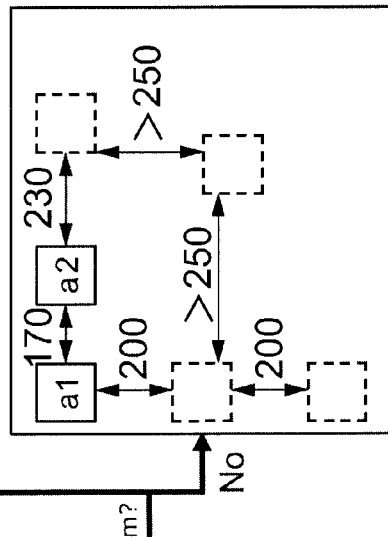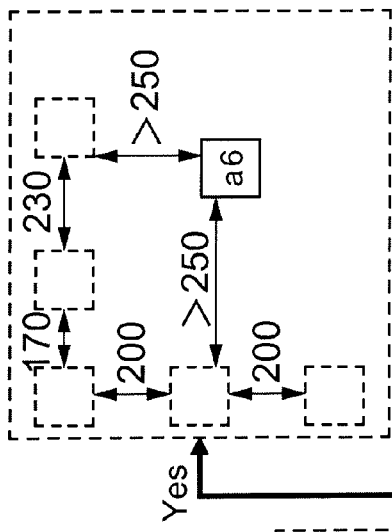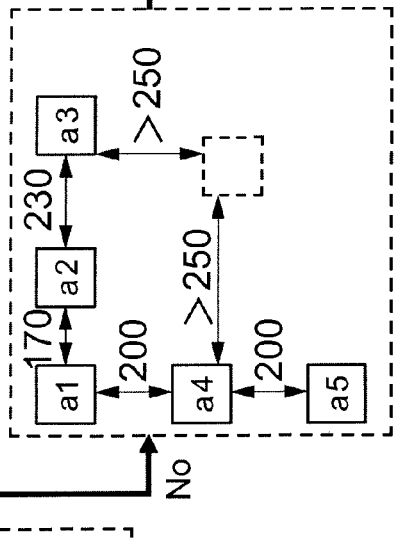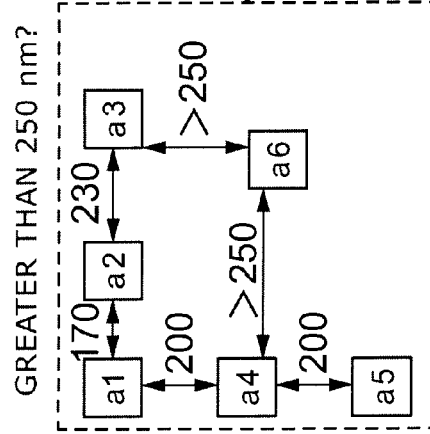

MASK PATTERN DATA CREATION METHOD AND MASK

CROSS-REFERENCE TO RELATED APPLICATIONS

This application is based upon and claims the benefits of priority from the prior Japanese Patent Application No. 2008-149370, filed on Jun. 6, 2008 and the prior Japanese Patent Application No. 2009-126283, filed on May 26, 2009; the entire contents of which are incorporated herein by reference.

BACKGROUND OF THE INVENTION

1. Field of the Invention

The present invention relates to a mask pattern data creation method and a mask used to form, for example, a semiconductor integrated circuit.

2. Background Art

It is known that during the exposure and transfer of relatively densely disposed periodic patterns such as, in particular, patterns for the formation of contact holes, process margins (an exposure amount margin and/or a focus margin) are improved in comparison with a perpendicular illumination by using a modified illumination such as a dipole illumination or a quadrupole illumination that irradiates obliquely onto a photomask. Therefore, assist pattern features referred to as SRAFs (sub-resolution assist features), etc., are formed on the mask in a size below the resolution limit during the wafer transfer so as not to transfer onto the wafer, and are disposed adjacent to actual patterns (main pattern features) to be transferred onto the wafer. This technology is known to improve the margin by artificially providing a periodicity to the pattern entirety (for example, JP-A 2008-66586 (Kokai)).

However, in the case where the main pattern features (the actual patterns to be transferred) are disposed at random pitches, adding assist pattern features of the same design uniformly to all main pattern features may result in cases where the maximum margin improvement effects due to the assist pattern features are not obtained for some pitches.

SUMMARY OF THE INVENTION

According to an aspect of the invention, there is provided a mask pattern data creation method that creates assist pattern feature data of an assist pattern feature.

The assist pattern feature is formed on a mask along with a plurality of main pattern features transferred to a transfer destination by an exposure and is not transferred to the transfer destination.

The method includes determining whether or not a spacing of the adjacent assist pattern feature data is not more than a prescribed spacing, based on: initial position data indicating an initially set position of the assist pattern feature data determined based on an illumination condition; and initial size data indicating an initially set size of the assist pattern feature data satisfying a size condition to not optically form an image on the transfer destination.

Continuing, the method includes moving at least one of the adjacent assist pattern feature data or reducing a size of the at least one to increase the spacing of the adjacent assist pattern feature data to exceed the prescribed spacing in the case where it is determined that the spacing of the assist pattern feature data is not more than the prescribed spacing.

According to another aspect of the invention, there is provided a mask pattern data creation method that creates assist pattern feature data of an assist pattern feature.

The assist pattern feature is formed on a mask along with a plurality of main pattern features transferred to a transfer destination by an exposure and is not transferred to the transfer destination.

The method includes deducing a relationship of position data and size data of the assist pattern feature data for at least one of the adjacent main pattern features, according to a spacing of the main pattern features.

Continuing, the method includes disposing the assist pattern feature data based on a relationship between the position data and the size data.

According to another aspect of the invention, there is provided a mask including a plurality of main pattern features and assist pattern features corresponding to the main pattern features.

The plurality of main pattern features include a first main pattern feature and a second main pattern feature.

In this aspect, a spacing between the adjacent first main pattern features is greater than a spacing between the adjacent second main pattern features. Further, a size of an assist pattern feature corresponding to the first main pattern feature is greater or smaller than a size of an assist pattern feature corresponding to the second main pattern feature.

BRIEF DESCRIPTION OF THE DRAWINGS

FIGS. 5A to 5E are schematic views illustrating pitch classification steps of a main pattern feature in the mask pattern data creation method according to the embodiment of the present invention;

DETAILED DESCRIPTION OF THE INVENTION

An embodiment of the present invention will now be described with reference to the drawings.

Figure 1:
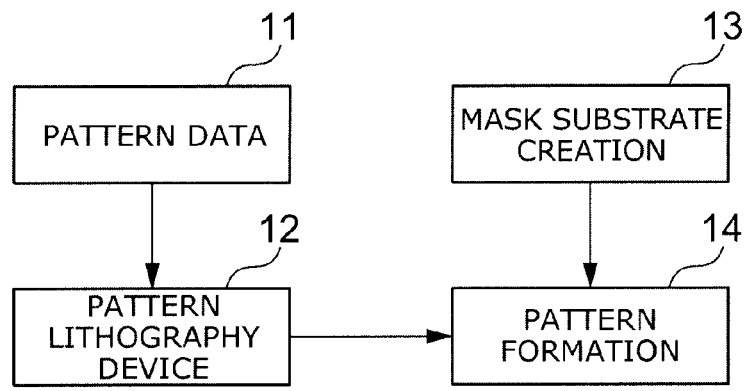
FIG. 1 is a schematic view illustrating a flow of the entire mask creation method according to the embodiment of the present invention.

FIG. 1 is a schematic view illustrating a flow of the entire mask creation method according to the embodiment of the present invention.

The mask creation method according to this embodiment can be largely divided into a step 13 that creates a mask substrate, a step that creates mask pattern data 11, and a step 14 that creates patterns on the mask substrate based on the mask pattern data 11.

Figure 2:
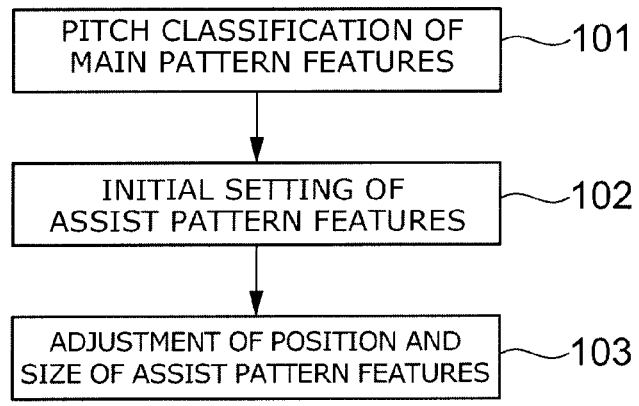
FIG. 2 is a flowchart of a pattern data creation method according to the embodiment of the present invention.
Figure 3:
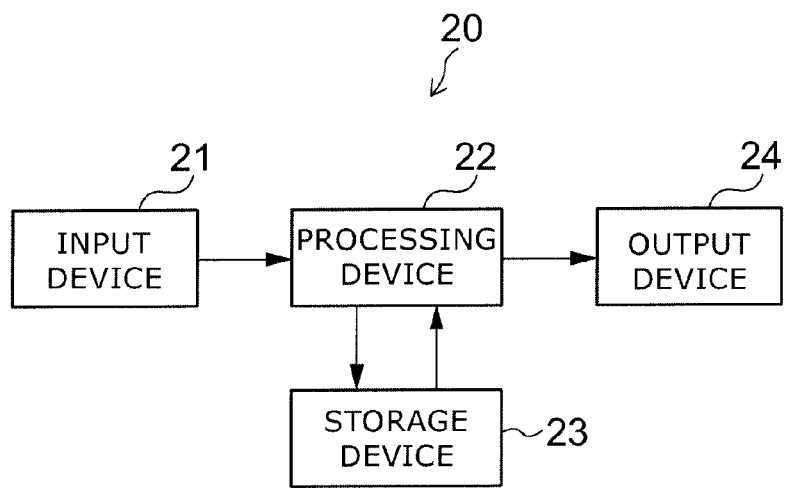
FIG. 3 is a function block diagram of a mask pattern data creation device according to the embodiment of the present invention.

FIG. 2 is a flowchart of a mask pattern data creation method, and FIG. 3 is a function block diagram of a mask pattern data creation device 20 that executes the same.

The mask pattern data creation device 20 includes an input device 21, a processing device 22, a storage device 23, and an output device 24.

A mask pattern data creation program according to the embodiment of the present invention is stored in the storage device 23. During the creation of mask pattern data, the processing device 22 reads the program and executes a mask pattern data creation processing described below based on a command of the program.

In this embodiment, a mask is created in which multiple main pattern features having non-periodic pitches (random pitches) are formed and assist pattern features are disposed around each main pattern feature. The main pattern features are, for example, patterns corresponding to contact holes of a semiconductor device. The main pattern features are actual patterns transferred onto a semiconductor wafer, i.e., a transfer destination, by an exposure using the mask.

The assist pattern features are formed in sizes below the resolution limit of the transfer. The assist pattern features themselves are not transferred onto the transfer destination (the semiconductor wafer), and perform the role of improving the resolution performance of the main pattern features by causing a desired interference effect during the exposure.

Even in the case where isolated main pattern features are disposed at random pitches, a periodicity can be artificially provided to the pattern entirety by adding assist pattern features. Then, by performing an off-axis illumination to such periodic patterns, a margin (or process window) of the lithography can be increased.

Figure 4:
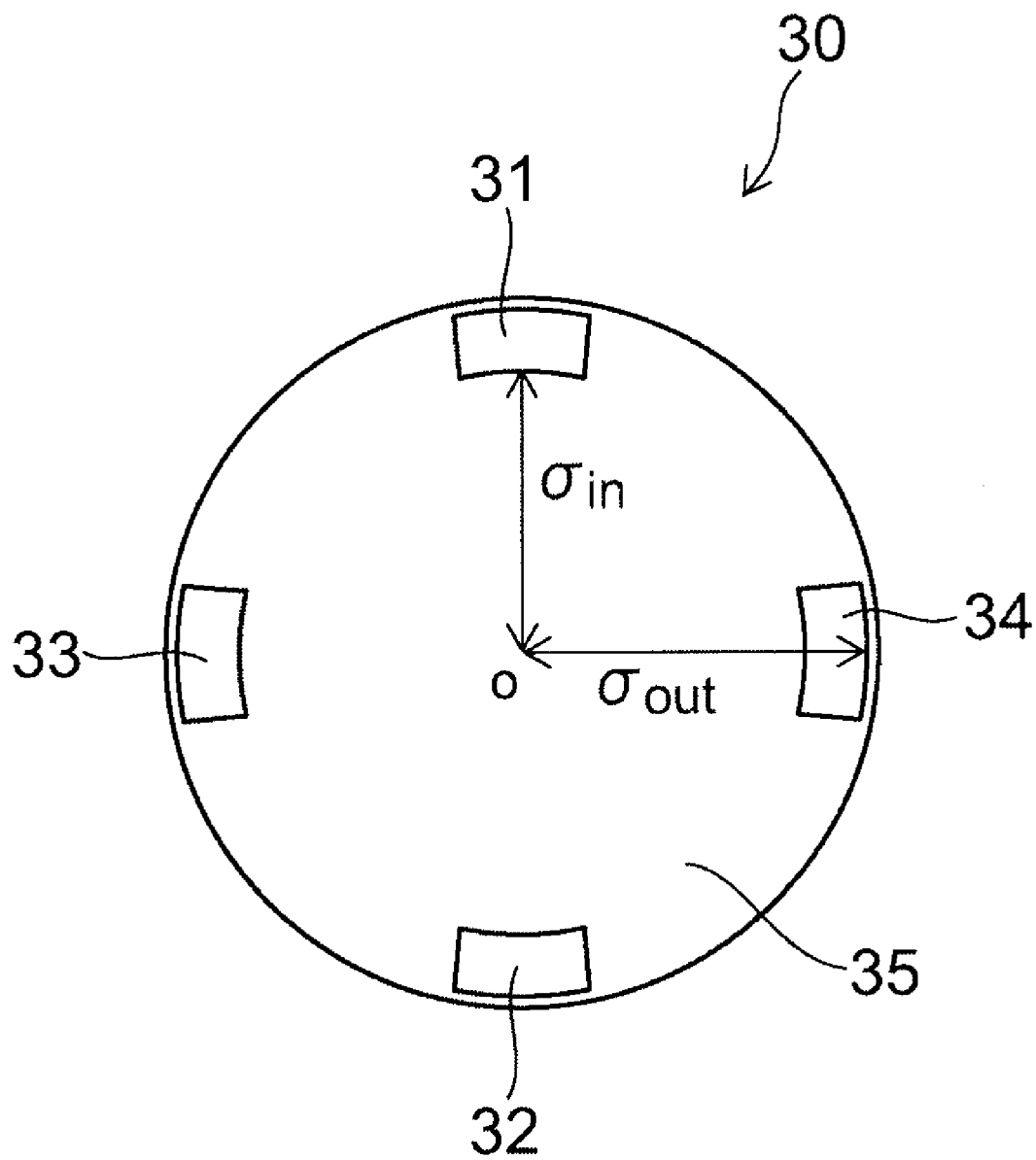
FIG. 4 is a schematic view illustrating a quadrupole illumination as an example of the off-axis modified illumination.

A quadrupole illumination 30 such as that illustrated in FIG. 4 is used in this embodiment as a light source of the off-axis illumination. The quadrupole illumination 30 includes four light emitting regions 31 to 34, and the other region is a light shielding region 35. The light emitting region 31 and the light emitting region 32 are symmetric with respect to a center O of the illumination. The light emitting regions 33 and 34 are positioned 90° from the light emitting regions 31 and 32. The light emitting region 33 and the light emitting region 34 are symmetric with respect to the center O.

The creation of the mask pattern data will now be described.

First, the main pattern features are classified by pitch (step 101 of FIG. 2).

FIG. 5A schematically illustrates a portion of a region in which multiple main pattern features are disposed at random pitches. Main pattern features a1 to a6 are disposed at random pitches in this region. As an example, the units of the pitches (numbers) illustrated in FIGS. 5A to 5E are nm (nanometers).

Although the pitches between the main pattern features are illustrated as the spacing between adjacent pattern edges in FIGS. 5A to 5E, the pitches may be the distances between centers of adjacent patterns.

First, it is determined whether or not the pitch to another main pattern feature (in the case where multiple main pattern features exist adjacently thereto, the minimum pitch thereof) is greater than 250 nm for each of the main pattern features a1 to a6 illustrated in FIG. 5A.

Here, the determination divides the main pattern feature a6 (FIG. 5B), which has a pitch to another adjacent main pattern feature greater than 250 nm, and the main pattern features a1 to a5 (FIG. 5C), which have pitches to other adjacent main pattern features of not more than 250 nm.

Then, it is determined whether or not the pitch to another main pattern feature (in the case where multiple main pattern features exist adjacent thereto, the minimum pitch thereof) is at least 200 nm for each of the main pattern features a1 to a5 illustrated in FIG. 5C.

Here, the determination divides the main pattern features a3 to a5 (FIG. 5D), which have pitches to other adjacent main pattern features of at least 200 nm, and the main pattern features a1 and a2 (FIG. 5E), which have pitches to other adjacent main pattern features of less than 200 nm.

Thus, the main pattern features are classified into three groups, that is, the main pattern feature a6 of which the pitch to another adjacent main pattern feature has a relatively expansive isolation tendency (an isolated pattern group), the main pattern features a1 and a2 having relatively narrow pitches (a narrow pitch group), and the main pattern features a3 to a5 having pitches intermediate between the isolated pattern group and the narrow pitch group (an intermediate pitch group). Of course, this classification example is but one example, and the pitches may be further classified into finer divisions.

The processing device 22 illustrated in FIG. 3 executes the pitch classification of the main pattern features described above. Pitch classification data obtained as a result of the processing is stored in the storage device 23.

Then, initial setting data of the assist pattern features is created (step 102 of FIG. 2). The initial setting data includes initial position data that indicates the initially set positions of the assist pattern features with respect to each main pattern feature, and initial size data that indicates the initially set sizes of the assist pattern features.

The initially set positions of the assist pattern features are set as follows based on exposure illumination conditions.

Figure 6A:
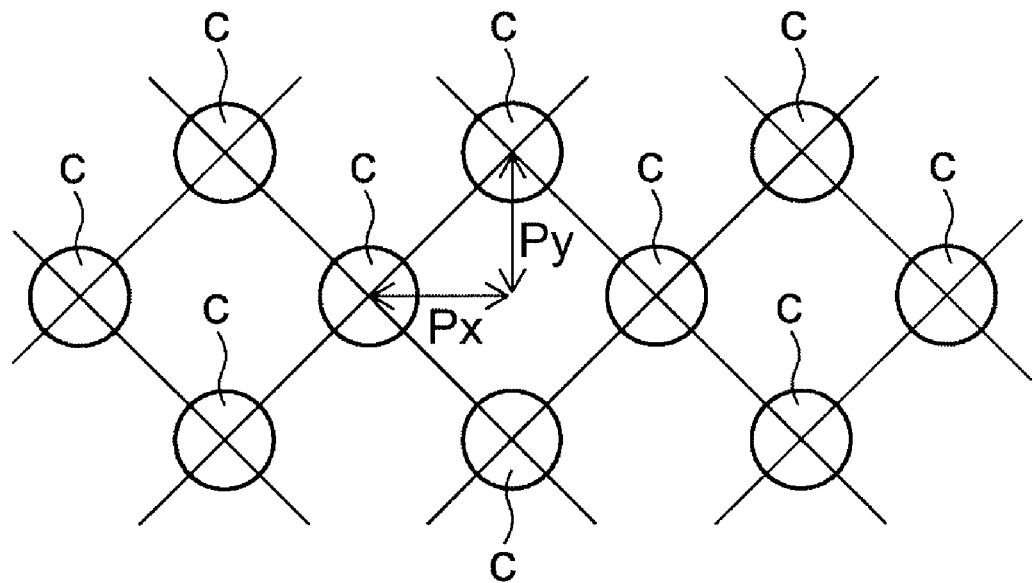
FIGS. 6A and 6B are schematic views illustrating mask pattern layout examples.

FIG. 6A illustrates a pattern layout in which multiple patterns c are disposed in a diagonal lattice configuration. In other words, any one pattern c has four other patterns c proximally disposed at four diagonal corners of the pattern c. When exposing the patterns c illustrated in FIG. 6A using the quadrupole illumination 30 illustrated in FIG. 4, the illumination conditions to obtain an optimal margin (an exposure amount margin and/or a focus margin) can be calculated by Formula 1.

$$\sigma_s = \frac{\lambda}{4NA}\left(\frac{Py}{Px^2} + \frac{1}{Py}\right) \quad \text{(Formula 1)}$$

where $\sigma_s = \frac{\sigma_{in} + \sigma_{out}}{2}$

Px is the pitch between pattern c centers in an x direction (a horizontal direction of FIG. 6A), and Py is the pitch between pattern c centers in a y direction (a vertical direction of FIG. 6A). λ is the wavelength of the quadrupole illumination light, and NA is the numerical aperture of a projection lens through which the illumination light passes. σin and σout are the inside radius and the outside radius, respectively, of the light emitting regions 31 to 34 in a σ coordinate system. The σ coordinate system has an origin point at the optical axis, and is a coordinate system in which the incident side numerical aperture of the projection optical system (the radius of the projection lens pupil) is standardized as unity.

Figure 6B:
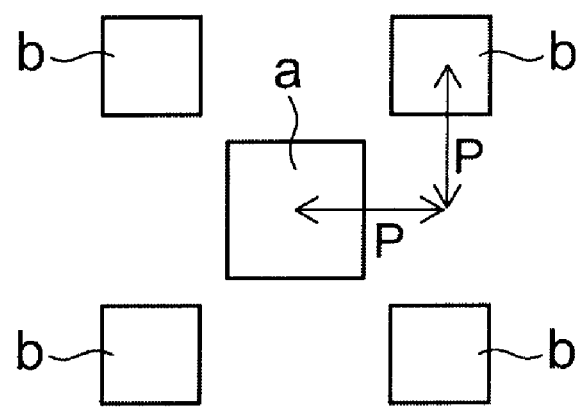

FIG. 6B illustrates a pattern example in which a main pattern feature a and four assist pattern features b added to each main pattern feature a are disposed in the diagonal lattice configuration arrangement illustrated in FIG. 6A. In other words, four assist pattern features b are disposed proximal to the main pattern feature a at four diagonal corners.

Assuming that the pitch in the x direction and the pitch in the y direction between the center of the main pattern feature a and the center of the assist pattern features b in FIG. 6B are the same P, then Px=Py in Formula 1; Formula 2-1 is obtained; and solving these formulas for the pitch P gives Formula 2-2.

$$\sigma_s = \frac{\lambda}{4NA}\left(\frac{1}{P} + \frac{1}{P}\right) = \frac{\lambda}{2NAP} \quad \text{(Formula 2-1)}$$

$$P = \frac{\lambda}{2NA\sigma_s} \quad \text{(Formula 2-2)}$$

Figure 7A:
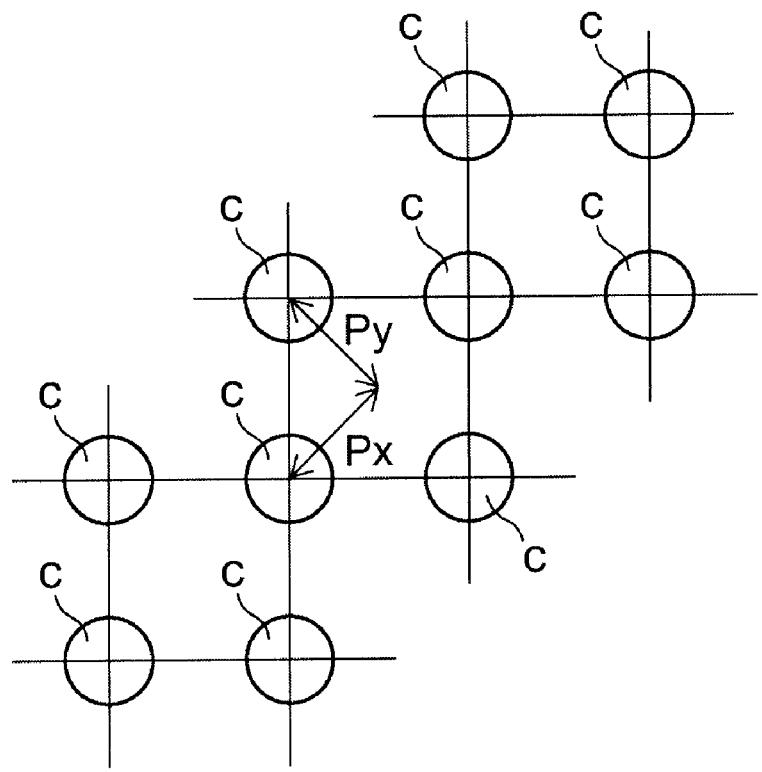
FIGS. 7A and 7B are schematic views illustrating other mask pattern layout examples.
Figure 7B:
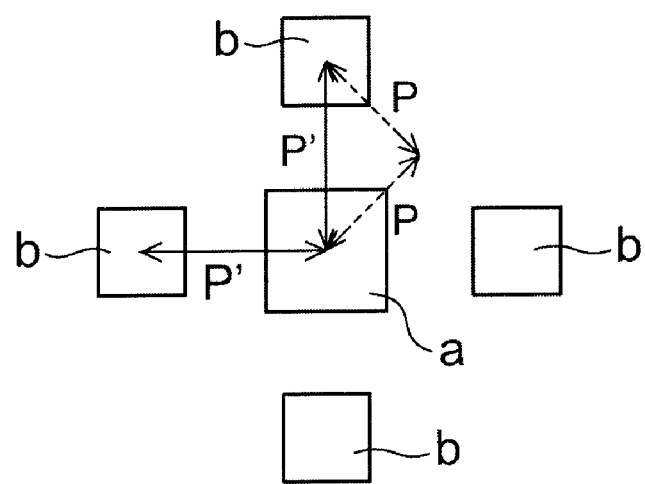

FIG. 7A illustrates a pattern example of the lattice configuration arrangement illustrated in FIG. 6A having the patterns c inclined at 45 degrees. Similarly, FIG. 7B illustrates an example in which the positional arrangement of the assist pattern features b with respect to the main pattern feature a is a positional arrangement revolved 45 degrees from the position illustrated in FIG. 6B.

In such a case, a relationship P'=(√2)P holds for P recited above and a pitch P' in the x direction and the y direction between the center of the main pattern feature a and the center of the assist pattern features b. Therefore, P' can be expressed in Formula 3 utilizing Formula 2-2 recited above.

$$P' = \sqrt{2}\,P = \frac{\lambda}{\sqrt{2}\,NA\sigma_s} \quad \text{(Formula 3)}$$

Thus, the parameters P and P' are determined to indicate the optimal positional arrangement (the positional arrangement at which the optimal margin is obtained) of the assist pattern features b with respect to the main pattern feature a using the illumination conditions (λ, NA, and σs) as functions.

The illumination conditions (λ, NA, and σs) are input by the input device 21 illustrated in FIG. 3. The processing device 22 uses the input data to perform the calculations recited above, ascertains P and P', and stores P and P' in the storage device 23 as the initial position data of the assist pattern features b. The input data and the processing result may be displayed or printed via, for example, a display, printer, etc., of the output device 24.

Then, the initially set sizes of the assist pattern features b are set by considering conditions such as non-resolution size conditions at which the assist pattern features b do not optically form images on the transfer destination.

Figure 8:
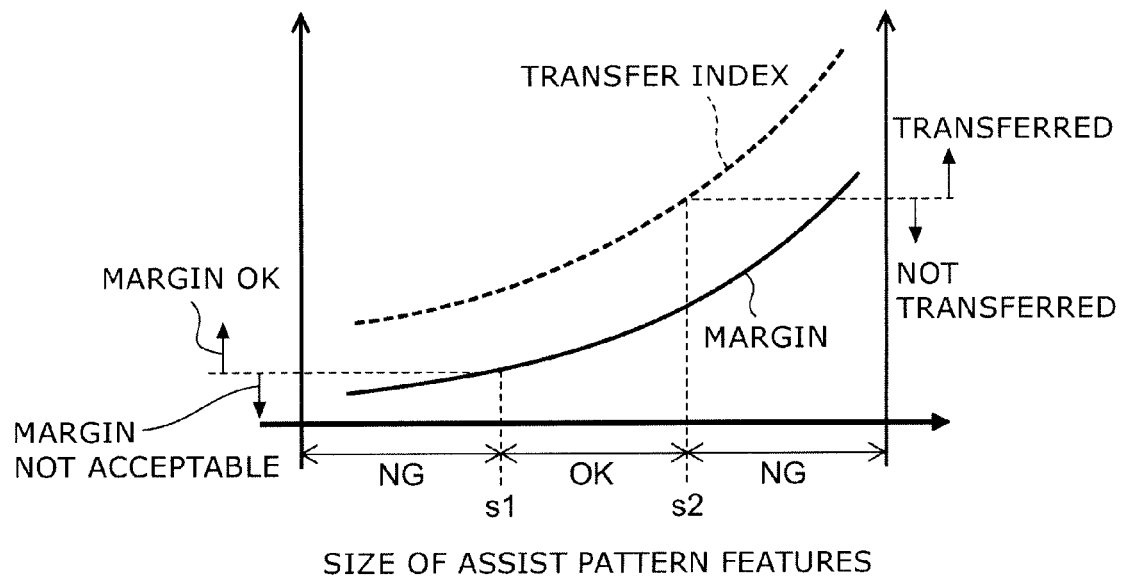
FIG. 8 is a graph illustrating a relationship between the assist pattern feature size and the margin and a relationship between the assist pattern feature size and a transfer index.

FIG. 8 illustrates a relationship (the solid-line curve) between the assist pattern feature size and the margin (the exposure amount margin and the focus margin) and a relationship (the broken-line curve) between the assist pattern feature size and a transfer index (for which a large index indicates a high risk of transfer).

As the size of the assist pattern feature increases, the margin increases; but the transfer index also increases, and the risk of transfer of an assist pattern feature that is not to be transferred undesirably increases. Accordingly, to avoid an undesirable transfer while ensuring the necessary margin, it is necessary to set the size of the assist pattern feature in an appropriate range (between a size s1 and a size s2 in the example of FIG. 8). The appropriate size conditions of the assist pattern features are determined also by considering other mask specifications, defect inspections, and the like. The size conditions are stored in the storage device 23 as the initial size data of the assist pattern features.

The initial setting data of the assist pattern features obtained as described above indicates the position/size of the assist pattern features most suitable to ensure the lithography margin of the main pattern features corresponding to contact hole pattern features. The initial setting data of the assist pattern features thus set may be commonly used by all patterns in the case where the main pattern feature pitch is a constant pitch at and above a certain pitch level. However, in the case where the main pattern features are disposed at random pitches, adding assist pattern features of the same design uniformly to all main pattern features may result in cases where the maximum margin improvement effects due to the assist pattern features are not obtained for some pitches.

Accordingly, in the case where the main pattern features are disposed at random pitches, it is necessary to appropriately modify the positions and the sizes of the assist pattern features disposed corresponding to each main pattern feature according to the pitch to another adjacent main pattern feature in the initial settings recited above.

Therefore, in the embodiment of the present invention, the initially set positions and the initially set sizes of the assist pattern features are appropriately adjusted by modifying the initial position data and the initial size data of the assist pattern features disposed around each main pattern feature according to differences in the pitches between adjacent main pattern features (step 103 of FIG. 2). For this adjustment, the processing device 22 illustrated in FIG. 3 reads the initial setting data and the pitch classification data recited above stored in the storage device 23 and executes a processing utilizing the data by following the pattern data creation program according to the embodiment of the present invention.

Figure 9:
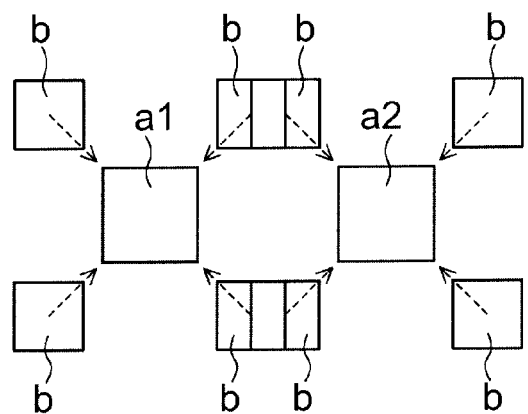
FIG. 9 is a schematic view illustrating a defect in which assist pattern features overlay in the case of a narrow pitch main pattern feature.

For example, in the case where the assist pattern features b are disposed at the initially set positions described above with respect to the main pattern features a1 and a2 having narrow pitches, adjacent assist pattern features b undesirably overlay each other as illustrated in FIG. 9, and the interference effect necessary to obtain the optimal margin cannot be obtained.

Therefore, in such a case, the mutual overlaying of the assist pattern features b can be avoided by moving each assist pattern feature b to a position more proximal to the center of the corresponding main pattern feature a1 or a2. However, shifting the assist pattern features b from the initially set positions recited above reduces the margin.

Figure 10A:
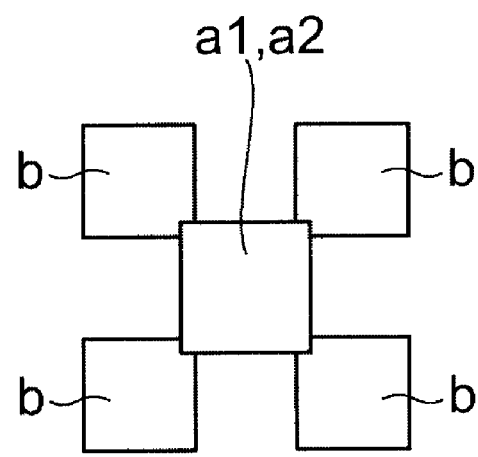
FIGS. 10A to 10C are schematic views illustrating pattern layout examples according to the embodiment of the present invention in which a position and a size of the assist pattern feature are changed in accordance with a pitch of the main pattern feature.

Therefore, in this embodiment as illustrated in FIG. 10A, the assist pattern features b are moved toward the center of the corresponding main pattern feature a1 (or a2) to avoid the overlay of the assist pattern features b; and then the sizes of the assist pattern features b are increased to exceed the initially set sizes recited above. Thereby, the decrease of the margin due to the movement of the position from the optimal position (the initially set position) is compensated, and the necessary margin is ensured. When increasing the size of an assist pattern feature b, the size is set to satisfy the size condition (not more than s2) described above with reference to FIG. 8 so that the assist pattern feature b is not undesirably transferred.

Although moving the assist pattern features from the initially set positions causes the margin to decrease from that prior to the movement, the margin to be ensured can be maintained in most cases.

On the other hand, in the case where the assist pattern features are disposed with respect to each main pattern feature based on the initial position data recited above, there may be cases where adjacent assist pattern features have a narrow spacing therebetween that violates mask constraint conditions required for the mask, even in the case where the assist pattern features do not overlay. To avoid such a violation, the sizes of the assist pattern features may be reduced in a range in which the necessary lithography margin can be ensured.

For the main pattern feature a6 having a relatively expansively isolated pitch to the adjacent main pattern feature, the assist pattern features b do not overlay the assist pattern features b of another main pattern feature. Therefore, it is not necessary to move the position of the assist pattern features b from the initially set positions recited above, and the decrease of the margin can be prevented. Further, a relatively expansive space is ensured around the main pattern feature a6. Therefore, even more improvement of the margin is possible by increasing the sizes of the assist pattern features b to exceed the initially set size as illustrated in FIG. 10C. In such a case as well, the sizes of the assist pattern features b are set to satisfy the size condition (not more than s2) such that the assist pattern features b are not undesirably transferred when increasing the size of the assist pattern features b.

Figure 10B:
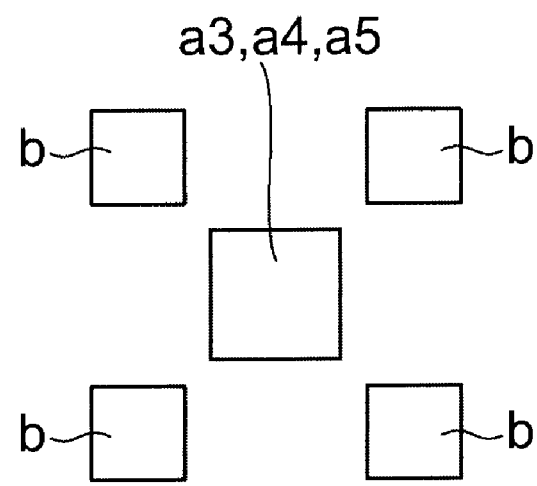
Figure 10C:
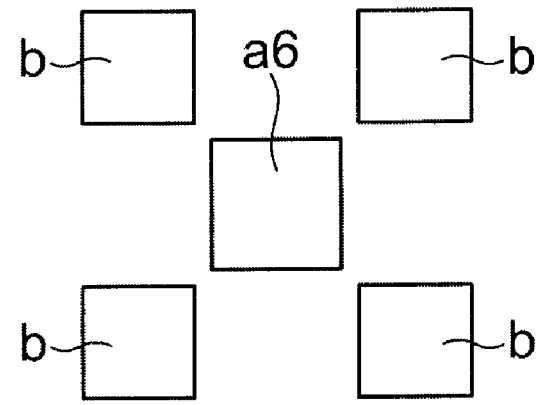

For the main pattern feature a3 (or a4 or a5) having an intermediate pitch, the positions and the sizes of the assist pattern features b are kept at the initial settings as illustrated in FIG. 10B to maintain the margin determined by the initial settings. Alternatively, in the case where ample space is available therearound, the sizes of the assist pattern features b may be increased to further improve the margin. Even in the case of the intermediate pitch, keeping the positions and the sizes of the assist pattern features b at the initial settings may cause the assist pattern features b to mutually overlay or be too proximal to each other. In this case, the positions of the assist pattern features b are moved from the initially set positions and the sizes thereof are changed from the initially set sizes so as to ensure the necessary margin.

By creating a table in advance for each pitch classification data of the main pattern features of the position/size of the assist pattern features appropriately moved/modified as described above from the initially set position/size, it is also possible to appropriately design the position/size of the assist pattern features by a simple method by referring to the table during the assist pattern feature design.

The pattern formation on the mask substrate is performed based on the mask pattern data thus created.

Figure 11A:
FIGS. 11A to 11F are process cross-sectional views illustrating a mask creation method according to the embodiment of the present invention.
Figure 11B:
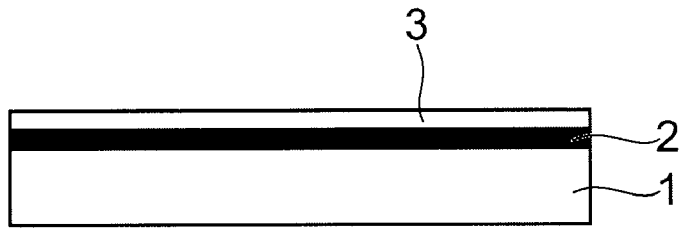
Figure 11C:
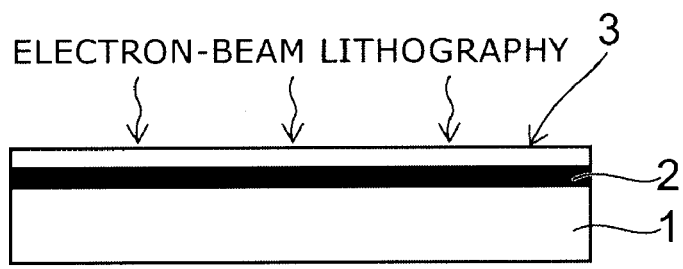

As illustrated in FIG. 11A, the mask substrate has a structure in which a light shielding film 2 is formed on a substrate (for example, a glass substrate) 1 which is transparent with respect to the exposure illumination wavelength. A resist (for example, an electron beam resist) 3 is formed on the light shielding film 2 as illustrated in FIG. 11B. The mask patterns (the main pattern features and the assist pattern features) described above are formed on the resist 3 by electron-beam lithography as illustrated in FIG. 11C.

In FIG. 1, the mask pattern data 11 is converted into a data format readable by a lithography device 12 and then input into the lithography device 12. The lithography device 12 then performs electron-beam lithography of the patterns onto the resist 3 based on the mask pattern data.

Figure 11D:
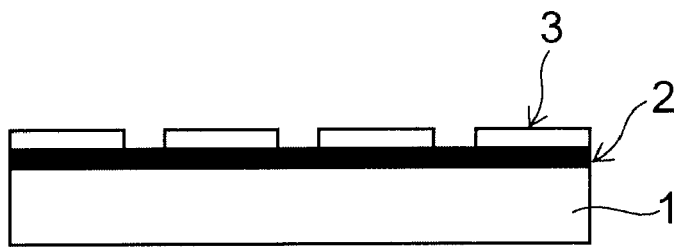
Figure 11E:
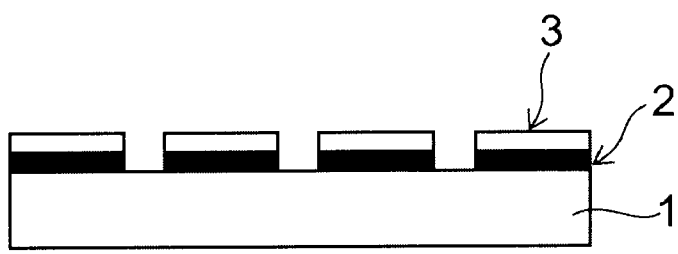

After the electron-beam lithography, the resist 3 is developed, and openings are made according to the mask patterns (FIG. 11D). Then, etching of the light shielding film 2 is performed using the resist 3 as a mask (FIG. 11E).

Figure 11F:
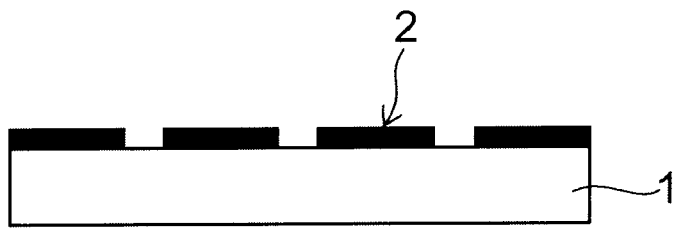

Continuing, the resist 3 is removed, and a mask is obtained in which the light shielding film 2 is patterned into the patterns recited above as illustrated in FIG. 11F. The openings made in the light shielding film 2 correspond to the main pattern features and the assist pattern features recited above. Alternatively, the light shielding film 2 portion remaining on the glass substrate 1 may correspond to the main pattern features and the assist pattern features recited above.

Thus, a mask is obtained in which the desired patterns (the main pattern features and the assist pattern features) are formed. Using this mask, the only main pattern features are exposed and transferred to a transfer destination such as, for example, a semiconductor wafer, a glass substrate of a flat panel display, and the like.

According to the embodiment of the present invention described above, when adding the assist pattern features to the main pattern features (actual pattern features) disposed at random pitches, the position of the assist pattern features which are determined based on the illumination conditions and the sizes of the assist pattern features which are determined based on consideration of the risk of transfer and the like are not fixed and are appropriately modified according to differences of the pitches of the main pattern features; and appropriately designed assist pattern features are added to each main pattern feature to improve the margin during the exposure and transfer. Then, by using the mask in which the patterns (the main pattern features and the assist pattern features) are formed, the main pattern features can be formed on the transfer destination with high precision, and the yield can be improved.

Problems for narrow pitches include, of course, those occurring when assist pattern features overlay each other, and the violation of mask constraint conditions when assist pattern features are too proximal to each other. In other words, in the case where the pitch between assist pattern features is too narrow, the desired assist pattern feature configuration cannot be guaranteed on the mask. Moreover, in the case where the assist pattern features are too proximal to each other and overlay, the interference effects unfortunately cannot be obtained; and because the sizes of the patterns are greater than the sizes of the initial individual assist pattern features, the risk of transfer increases.

Figure 13:
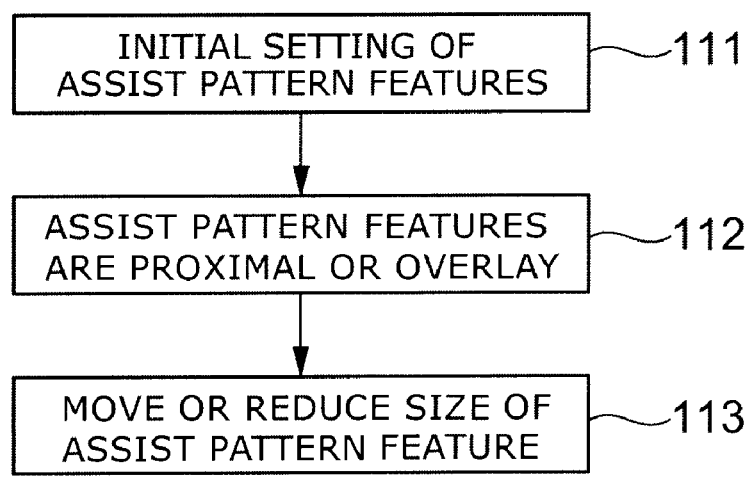
FIG. 13 is a flowchart of pattern data creation method according to another embodiment of the present invention.

Therefore, in the embodiment of the present invention as illustrated in the flow of FIG. 13, after the initial setting of the assist pattern features (step 111), it is determined whether or not a spacing between adjacent assist pattern features disposed based on the initial setting data is not more than a prescribed spacing. That is, it is determined whether or not the assist pattern features are proximal to each other by not more than the prescribed spacing or mutually overlay. In the case where it is determined that the assist pattern features in an adjacent positional relationship are proximal to each other by not more than the prescribed spacing (a spacing that violates the mask constraints), or in the case where it is determined that the assist pattern features mutually overlay (step 112), at least one of the proximal assist pattern features is moved or the size of at least one of the proximal assist pattern feature data is reduced to increase the spacing of the assist pattern features to exceed the prescribed spacing (step 113).

In the case of a narrow pitch, the movement of the assist pattern feature is not limited to being moved toward the center of the main pattern feature. A countermeasure also is possible by leaving the position of the assist pattern feature as-is and slightly reducing the size, as long as the mask constraints are not violated and the necessary lithography margin is ensured. In the case where the pitch is too narrow and it is not possible to avoid the mask constraint violation without considerably reducing the size of the assist pattern feature, the assist pattern feature can be moved toward the center of the main pattern feature.

One example of a mask created by the design method described above includes multiple main pattern features and an assist pattern feature corresponding to each main pattern feature. The main pattern features includes a first main pattern feature and a second main pattern feature. A spacing between adjacent first main pattern features is greater than a spacing between adjacent second main pattern features. A size of an assist pattern feature corresponding to the first main pattern feature is greater or smaller than a size of an assist pattern feature corresponding to the second main pattern feature.

Conventionally, in the case where periodic patterns and non-periodic (random) patterns are transferred onto the same semiconductor wafer, the periodic patterns are exposed and transferred using an off-axis illumination suitable for the periodic patterns; the random patterns are exposed and transferred using a perpendicular illumination; and thus, separate steps are performed. Conversely, according to the embodiment of the present invention, it is unnecessary to change the illumination and perform the exposure in separate steps for the periodic patterns and the random patterns to transfer the patterns onto the same semiconductor wafer. In other words, both the periodic patterns and the random patterns can be exposed and transferred by an exposure using the off-axis illumination, and the manufacturing efficiency improves.

The embodiment described above illustrates an example in which an assist pattern feature group (hereinbelow referred to simply as "a group") composed of a plurality of (for example, four) assist pattern features b is disposed around one main pattern feature a to correspond thereto, as shown in FIG. 6B and FIG. 7B. However, the number of the assist pattern feature b added to one main pattern feature a is not limited to four and even not to a plural number, but may be one.

In the embodiment described above, the position and the size of all the assist pattern features b falling under the same group added to one main pattern feature a are set equivalent. Specifically, the position and the size of each assist pattern feature falling under the same group are set evenly to a position and a size determined according to the spacing between the target main pattern feature to which the assist pattern feature is added and another main pattern feature most proximal to the main pattern feature.

For example, the main pattern feature a1 shown in FIG. 5A described above is adjacent to the main pattern feature a2 and the main pattern feature a4 by respective different spacings. The spacing between the main pattern feature a1 and the main pattern feature a2 is smaller than the spacing between the main pattern feature a1 and the main pattern feature a4. In this occasion, the position and the size of, for example, four assist pattern features falling under the same group disposed around the main pattern feature a1 are set evenly to the position and the size determined based on the smallest among the spacings between the main pattern feature a1 and other main pattern features adjacent thereto (in this case, the spacing between the main pattern feature a1 and the main pattern feature a2).

That is, the assist pattern features added to the main pattern feature a1 have the position and the size determined according to the spacing between the main pattern feature a1 and the main pattern feature a2. The assist pattern features added to the main pattern feature a1 can be disposed beside the main pattern feature a1 without overlaying an assist pattern feature added to another main pattern feature a2, which is different from the main pattern feature a1, between the main pattern feature a1 and the main pattern feature a2, or without being proximal thereto by not more than the prescribed spacing that violates the mask constraint conditions.

Therefore, also in the region between the main pattern feature a1 and the main pattern feature a4 (the region below the main pattern feature a1) having a wider spacing than that between the main pattern feature a1 and the main pattern feature a2, an assist pattern feature (assist pattern feature added to the main pattern feature a1) having the position and the size recited above determined according to the spacing between the main pattern feature a1 and the main pattern feature a2 can be disposed without overlaying an assist pattern feature added to the main pattern feature a4, or without being proximal thereto by not more than the prescribed spacing.

On the contrary, in the case where the position and the size of the assist pattern features added to the main pattern feature a1 are set according to the spacing between the main pattern feature a1 and the main pattern feature a4, when an assist pattern feature is disposed between the main pattern feature a1 and the main pattern feature a2, it may undesirably overlay an assist pattern feature added to the main pattern feature a2 or be proximal thereto by not more than the prescribed spacing.

The aforementioned illustrated the assist pattern features added to the main pattern feature a1. Also for other main pattern features, the position and the size of an assist pattern feature added thereto are set based on a similar perspective. For example, also for the plurality of (for example, four) assist pattern features added to the main pattern feature a2, the position and the size are applied thereto which are determined according to the spacing between the main pattern feature a2 and the main pattern feature a1 which is a smaller spacing between main pattern features, not according to the spacing between the main pattern feature a2 and the main pattern feature a3 which is a greater spacing. This position and size are applied to all the assist pattern features falling under the same group (group corresponding to the main pattern feature a2) disposed around the main pattern feature a2.

As described above, the method of evenly equally setting the position and the size of each assist pattern feature falling under the same group disposed to correspond to one main pattern feature is effective for reduction of processing time of the assist pattern feature arrangement.

Figure 14:
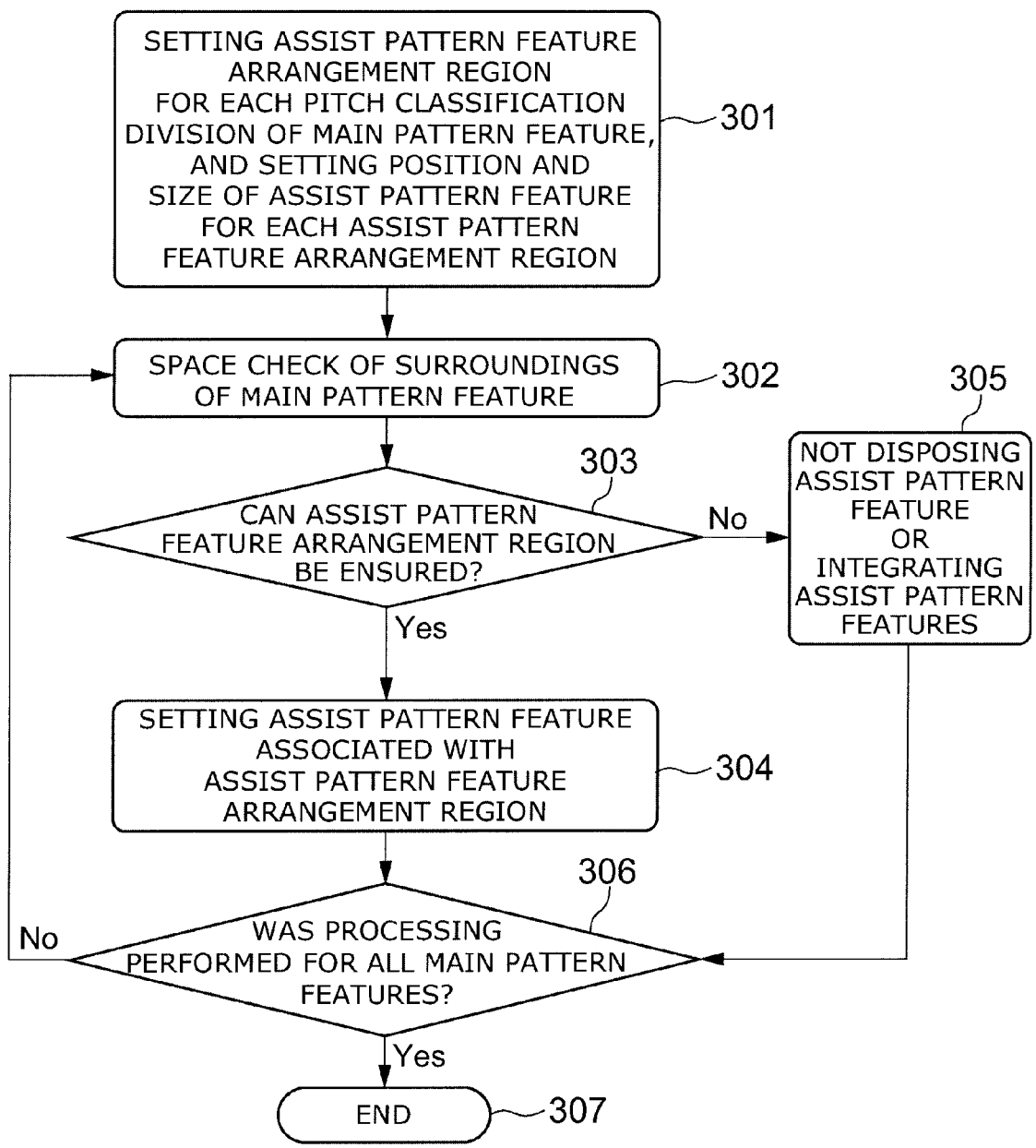
FIG. 14 is a flowchart of a pattern data creation method according to another embodiment of the present invention.

Next, FIG. 14 is a flowchart of a pattern data creation method according to another embodiment of the present invention. In the embodiment, the position and the size of each individual assist pattern feature data falling under the same group added to correspond to the same main pattern feature are set for each individual assist pattern feature data according to the spacing between the adjacent main pattern feature data, independently of the position and the size of another assist pattern feature data falling under the above same group.

First, pitch classification of the main pattern features is performed. Then, an assist pattern feature arrangement region is set for each classified pitch, and the position and the size of the assist pattern feature disposed in the set region are associated with the assist pattern feature arrangement region (step 301).

Figure 15A:
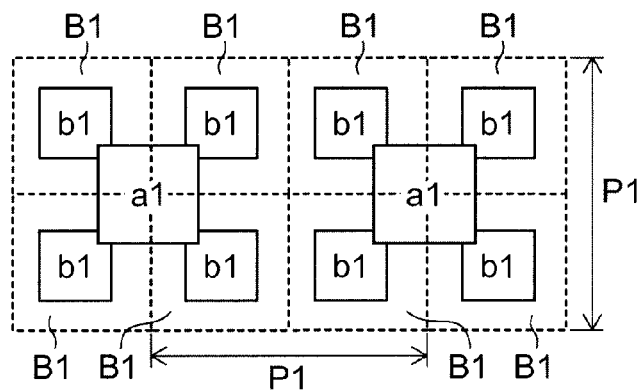
FIG. 15A is a schematic view showing two main pattern features a1 adjacent to each other by a pitch P1 and assist pattern features b1 appended to each main pattern feature a1.

FIG. 15A shows two main pattern features a1 adjacent to each other by a pitch P1. These main pattern features a1 are adjacent to, in addition to each other by the pitch P1, main pattern features not shown in two orthogonal directions (the horizontal and vertical directions in FIG. 15A) by the pitch P1.

Assist pattern arrangement regions B1 are set around each main pattern feature a1. The example shown in FIG. 15A sets first a square indicated by the broken line with a center identical to that of each main pattern feature a1 and one side P1 in length. Then, the square is divided in quarters by the lines vertically and horizontally bisecting the square to set each quartered region as the assist pattern feature arrangement region B1 corresponding to the pitch P1. The pitch P1 is not less than 100 nm and less than 140 nm, for example. The assist pattern feature arrangement region B1 has a square shape with one side (P1/2) in length.

Once the assist pattern feature arrangement region B1 is set, the position and the size of the assist pattern feature b1 disposed in the assist pattern feature arrangement region B1 are set. In this case, like the embodiment described above, the position and the size of the assist pattern feature b1 are set so that the adjacent assist pattern features do not mutually overlay or are not proximal to each other by not more than the prescribed spacing and further the necessary margin is obtained, considering exposure illumination conditions, margins, non-resolution size conditions at which the assist pattern features do not transferred, mask specifications, and the like.

Figure 15B:
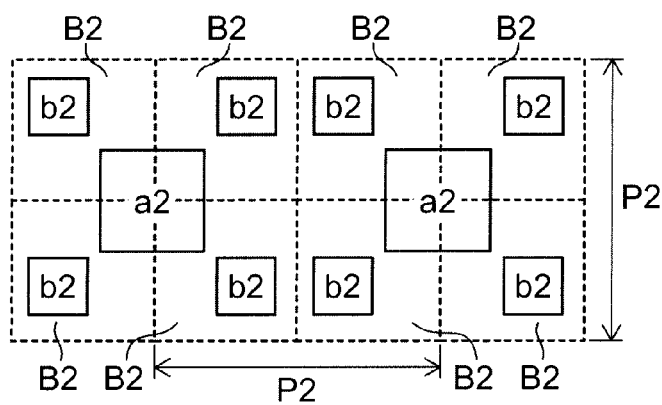
FIG. 15B is a schematic view showing two main pattern features a2 adjacent to each other by a pitch P2 and assist pattern features b2 appended to each main pattern feature a2.

FIG. 15B shows two main pattern features a2 adjacent to each other by a pitch P2 greater than the pitch P1. These main pattern features a2 are adjacent to, in addition to each other by the pitch P2, main pattern features not shown in two orthogonal directions (the horizontal and vertical directions in FIG. 15B) by the pitch P2.

Assist pattern arrangement regions B2 are set around each main pattern feature a2. The example shown in FIG. 15B sets first a square indicated by the broken line with a center identical to that of each main pattern feature a2 and one side P2 in length. Then, the square is divided in quarters by the lines vertically and horizontally bisecting the square to set each quartered region as the assist pattern feature arrangement region B2 corresponding to the pitch P2. The pitch P2 is not less than 140 nm and less than 180 nm, for example. The assist pattern feature arrangement region B2 has a square shape with one side (P2/2) in length.

Once the assist pattern feature arrangement region B2 is set, the position and the size of the assist pattern feature b2 disposed in the assist pattern feature arrangement region B2 are set. In this case as well, like the embodiment described above, the position and the size of the assist pattern feature b2 are set so that the adjacent assist pattern features do not mutually overlay or are not proximal to each other by not more than the prescribed spacing and further the necessary margin is obtained, considering exposure illumination conditions, margins, non-resolution size conditions at which the assist pattern features do not transferred, mask specifications, and the like.

Figure 15C:
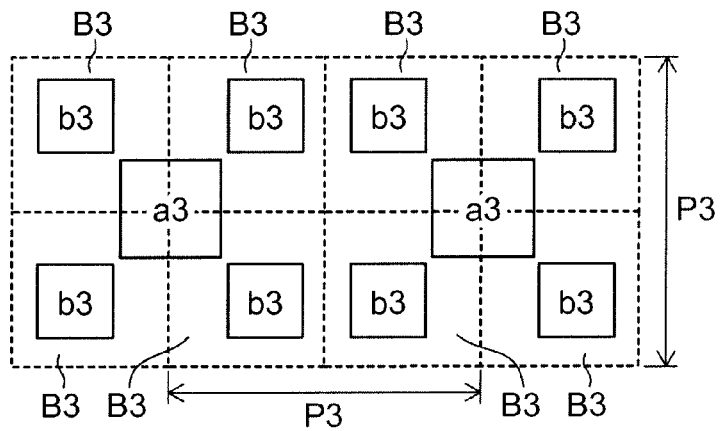
FIG. 15C is a schematic view showing two main pattern features a3 adjacent to each other by a pitch P3 and assist pattern features b3 appended to each main pattern feature a3.

FIG. 15C shows two main pattern features a3 adjacent to each other by a pitch P3 greater than the pitch P2. These main pattern features a3 are adjacent to, in addition to each other by the pitch P3, main pattern features not shown in two orthogonal directions (the horizontal and vertical directions in FIG. 15C) by the pitch P3.

Assist pattern arrangement regions B3 are set around each main pattern feature a3. The example shown in FIG. 15C sets first a square indicated by the broken line with a center identical to that of each main pattern feature a3 and one side P3 in length. Then, the square is divided in quarters by the lines vertically and horizontally bisecting the square to set each quartered region as the assist pattern feature arrangement region B3 corresponding to the pitch P3. The pitch P3 is not less than 180 nm and less than 250 nm, for example. The assist pattern feature arrangement region B3 has a square shape with one side (P3/2) in length.

Once the assist pattern feature arrangement region B3 is set, the position and the size of the assist pattern feature b3 disposed in the assist pattern feature arrangement region B3 are set. In this case as well, like the embodiment described above, the position and the size of the assist pattern feature b3 are set so that the adjacent assist pattern features do not mutually overlay or are not proximal to each other by not more than the prescribed spacing and further the necessary margin is obtained, considering exposure illumination conditions, margins, non-resolution size conditions at which the assist pattern features do not transferred, mask specifications, and the like.

Figure 15D:
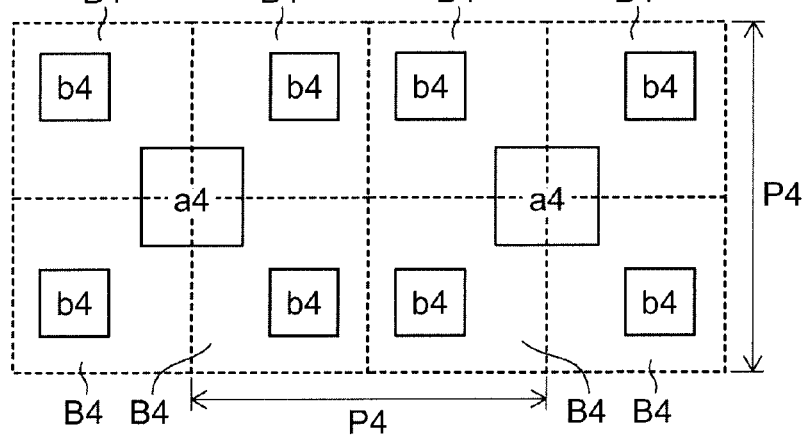
FIG. 15D is a schematic view showing two main pattern features a4 adjacent to each other by a pitch P4 and assist pattern features b4 appended to each main pattern feature a4.

FIG. 15D shows two main pattern features a4 adjacent to each other by a pitch P4 greater than the pitch P3. These main pattern features a4 are adjacent to, in addition to each other by the pitch P4, main pattern features not shown in two orthogonal directions (the horizontal and vertical directions in FIG. 15D) by the pitch P4.

Assist pattern arrangement regions B4 are set around each main pattern feature a4. The example shown in FIG. 15D sets first a square indicated by the broken line with a center identical to that of each main pattern feature a4 and one side P4 in length. Then, the square is divided in quarters by the lines vertically and horizontally bisecting the square to set each quartered region as the assist pattern feature arrangement region B4 corresponding to the pitch P4. The pitch P4 is not less than 250 nm, for example. The assist pattern feature arrangement region B4 has a square shape with one side (P4/2) in length.

Once the assist pattern feature arrangement region B4 is set, the position and the size of the assist pattern feature b4 disposed in the assist pattern feature arrangement region B4 are set. In this case as well, like the embodiment described above, the position and the size of the assist pattern feature b4 are set so that the adjacent assist pattern features do not mutually overlay or are not proximal to each other by not more than the prescribed spacing and further the necessary margin is obtained, considering exposure illumination conditions, margins, non-resolution size conditions at which the assist pattern features do not transferred, mask specifications, and the like.

As described above, in this embodiment, the assist pattern feature arrangement regions B1-B4 are set for pitches P1-P4, respectively, between the adjacent main pattern features, and the position and the size of the assist pattern feature to be disposed are associated with each of the assist pattern feature arrangement regions B1-B4.

Such a processing is performed by the processing device 22 shown in FIG. 3. The assist pattern feature arrangement regions B1-B4 for respective pitch classification divisions, and the position and size data of the assist pattern feature associated with each of the assist pattern feature arrangement regions B1-B4 obtained by the processing are stored in the storage device 23, and referred to during the assist pattern feature arrangement processing described later.

The pitch classification is not limited to a fourfold classification, and may have finer divisions. Further, although the example described above classified pitches not less than 100 nm, a classification including a pitch of less than 100 nm may be created.

Next, the assist pattern features are disposed around each main pattern feature. To this end, first, it is checked how wide the space around the main pattern feature (a region in which other main pattern features do not exist) is (step 302 in FIG. 14).

Then, in the next step 303, it is determined whether or not the assist pattern feature arrangement region corresponding to the smallest pitch classification division (in the case of the classification example described above, the assist pattern feature arrangement region B1 corresponding to the pitch P1 shown in FIG. 15A) can be ensured in the target region around the main pattern feature.

In the case of "Yes" in the determination of step 303, the next step 304 is conducted where an assist pattern feature arrangement region of a maximum size is selected which can be ensured in the currently relevant target region, and an assist pattern feature of the position and the size associated with the selected assist pattern feature arrangement region is disposed around the main pattern feature. This processing will now be specifically described with reference to FIGS. 16A and 16B.

Figure 16A:
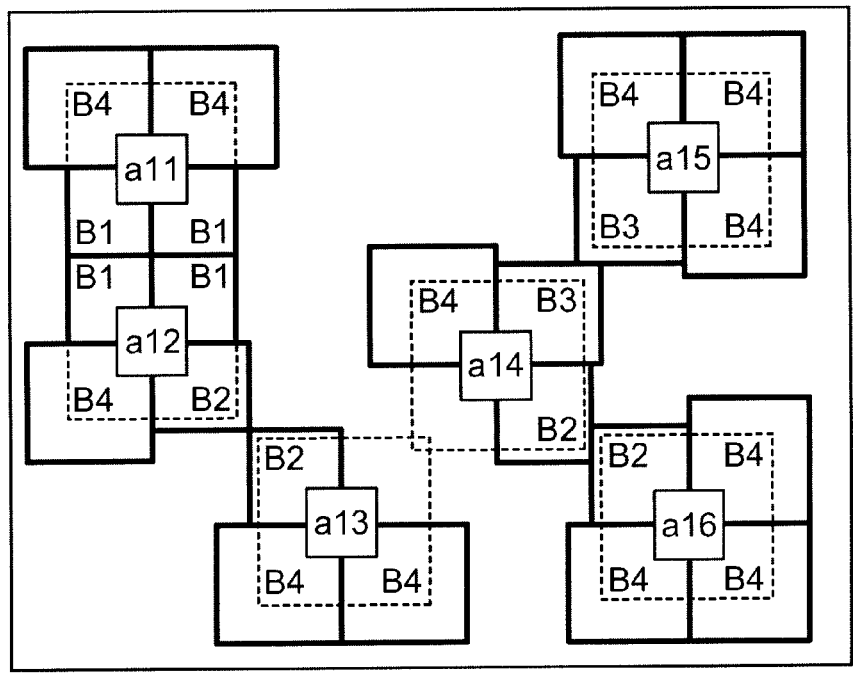
FIGS. 16A and 16B are schematic views of a region in which a plurality of main pattern features are disposed by random pitches.

FIG. 16A shows a region in which six main pattern features a11-a16, for example, are disposed by random pitches (data processing region). In FIG. 16A, the regions surrounded by the heavy lines are the assist pattern feature arrangement regions B1-B4 set around each of the main pattern features a11-a16. The squares indicated by the broken lines in FIG. 16A which have a center identical to that of the respective main pattern features a11-a16 have a length of one side of the minimum pitch P1 (FIG. 15A) in the classification described above.

Figure 16B:
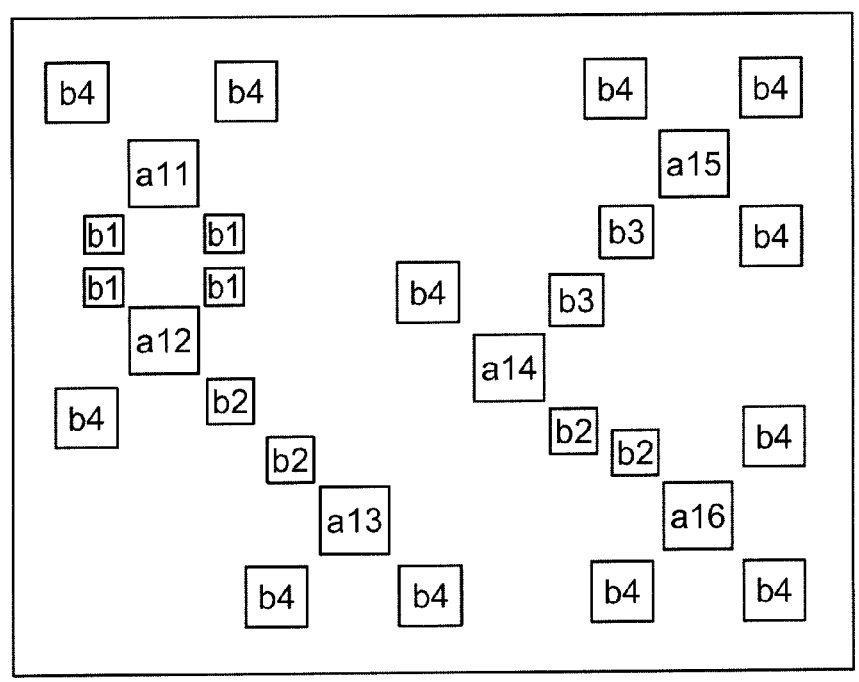

FIG. 16B shows the state in which, in the assist pattern feature arrangement regions B1-B4 shown in FIG. 16A, the corresponding assist pattern features b1-b4 are disposed, respectively.

For example, it is taken up the case of disposing the assist pattern features around the main pattern feature a11. The main pattern feature a12 exists below the main pattern feature a11 in FIG. 16A. Here, assuming that the pitch between the main pattern feature a11 and the main pattern feature a12 is P1 (for example, not less than 100 nm and less than 140 nm), the assist pattern feature arrangement region B1 corresponding to the pitch P1 is set below the main pattern feature a11.

In the assist pattern feature arrangement region B1, the assist pattern feature b1 having the position and the size associated with this assist pattern feature arrangement region B1 is disposed, as shown in FIG. 16B.

In the case where a space check of the region above the main pattern feature a11 in FIG. 16A made it clear that the pitch between the main pattern feature a11 and another main pattern feature is P4 (for example, not less than 250 nm) on the region side, the assist pattern feature arrangement region B4 corresponding to the pitch P4 is set in the region above the relevant main pattern feature a11.

In the assist pattern feature arrangement region B4, the assist pattern feature b4 having the position and the size associated with this assist pattern feature arrangement region B4 is disposed, as shown in FIG. 16B.

Thus, the four assist pattern features falling under the same group corresponding to the main pattern feature a11 (two assist pattern features by and two assist pattern features b4) are disposed around the main pattern feature a11.

According to this embodiment, the position and the size of the four assist pattern features added to the same main pattern feature a11 and falling under the same group are set according to the sizes of the individual regions in which the respective assist pattern features are disposed.

In the case of the fourfold classification illustrated in FIGS. 15A to 15D, the position of the assist pattern feature b4 associated with the assist pattern feature arrangement region B4 with the largest size shown in FIG. 15D (relative position to the main pattern feature a4, an addition target) corresponds to the initially set position determined based on the exposure illumination conditions described above, which is the optimal position for ensuring the necessary margin. However, if the assist pattern feature b4 is applied to pitches narrower than the pitch P4 as well, the adjacent assist pattern features may undesirably mutually overlay or be proximal to each other by not more than the prescribed spacing, resulting in violation of the mask constraint conditions.

Accordingly, as to the pitches P1, P2, and P3 narrower than the pitch P4, the assist pattern feature arrangement regions B1, B2, and B3 are set which are smaller than the assist pattern feature arrangement region B4 corresponding to the pitch P4, and the positions of the assist pattern features b1, b2, and b3 disposed in the assist pattern feature arrangement regions B1, B2, and B3, respectively, are shifted toward the center of the target main pattern feature so as to widen the spacing to other assist pattern features.

The shift of the position of the assist pattern feature from the optimal position causes reduction of the margin. Therefore, to compensate this, the sizes of the assist pattern features b1, b2, and b3 are suitably set according to the positions of the assist pattern features b1, b2, and b3, respectively.

If only the position of the assist pattern feature is focused, the position of the assist pattern feature b4 is optimal, whereas the positions of the assist pattern features b3, b2, and b1 are greater in this order in shift length from the optimal position due to the requirement of avoiding interference with other assist pattern features.

Therefore, if the assist pattern feature arrangement region B4 can be ensured around the main pattern feature, the assist pattern feature b4 is disposed in the region. If the assist pattern feature arrangement region B4 cannot be ensured, that is, the assist pattern feature arrangement region B4 overlays an assist pattern feature arrangement region pertaining to another main pattern feature, an assist pattern feature arrangement region which has the largest size capable of being ensured among the remaining assist pattern feature arrangement regions B1, B2, and B3 is selected. Then, in the selected assist pattern feature arrangement region, the assist pattern feature associated with the selected region is disposed. It is noted that the fourfold classification shown in FIGS. 15A to 15D is but one example, and the classification may have finer divisions.

That is, if any of the assist pattern feature arrangement regions B1-B4 can be ensured according to the pitch between the main pattern features, the necessary margin can be obtained by disposing the assist pattern feature having the position and the size associated with each of the assist pattern feature arrangement regions B1-B4, without overlaying of the assist pattern feature and another assist pattern feature or proximity therebetween by not more than the prescribed spacing, further without undesirable transfer of the assist pattern feature.

In the region between, for example, the main pattern feature a13 and the main pattern feature a14 in FIG. 16A, the squares indicated by the broken lines mutually overlay, which have a length of one side of the minimum pitch P1 (FIG. 15A) in the classification described above. The overlaying of these squares means mutual overlaying of the assist pattern feature arrangement regions B1 of the minimum size in the classification shown in FIGS. 15A to 15D. The mutual overlaying of the assist pattern feature arrangement regions B1 of the minimum size means mutual overlaying of the assist pattern features by associated with the assist pattern feature arrangement regions B1 or mutual proximity thereof by a spacing not more than the prescribed spacing which cannot be allowed by the mask specifications, resulting in violation of the mask constraint conditions. Namely, it means that the region in which the squares recited above mutually overlay is a region in which even the assist pattern feature associated with the minimum pitch cannot be disposed.

In this case, the step 303 in FIG. 14 draws a conclusion of "No," leading to the step 305 where, as shown in FIG. 16B, no assist pattern feature is disposed between the main pattern feature a13 and the main pattern feature a14. Here, if assist pattern feature arrangement regions with a smaller size corresponding to a finer pitch are created, two assist pattern features corresponding to the respective main pattern features can be disposed also between the main pattern feature a13 and the main pattern feature a14, without mutual overlaying or excessive mutual proximity, by disposing assist pattern features with a smaller size associated with the assist pattern feature arrangement regions at appropriate positions.

Figure 17:
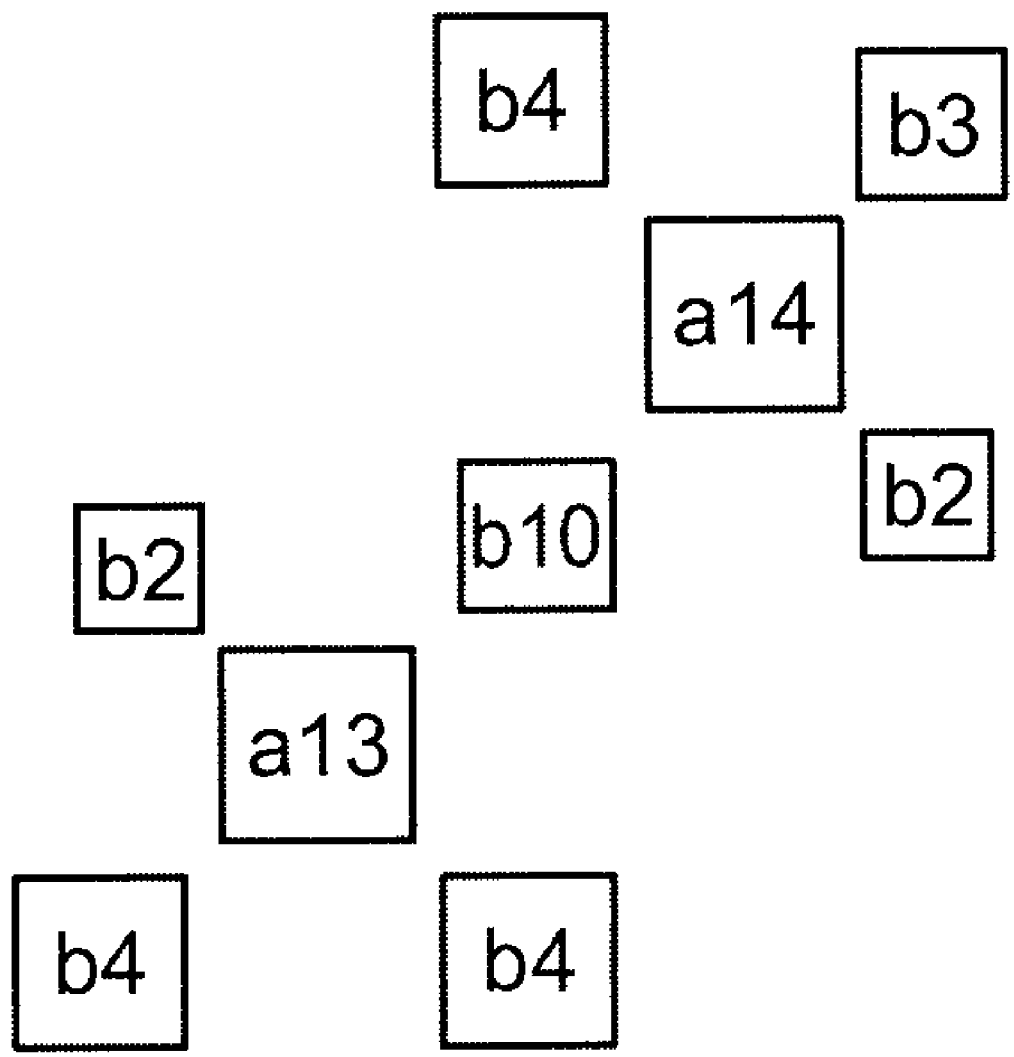
FIG. 17 is a schematic view of a region in which two mutually overlaid assist pattern features are integrated into one assist pattern feature b10 to be disposed.

Otherwise, as shown in FIG. 17, it is also possible that one assist pattern feature b10 created by integrating two mutually overlaid assist pattern features is disposed shared by the main pattern feature a13 and the main pattern feature a14. This processing can be expressed also as a process of reducing the size of one of the two assist pattern features mutually overlaying or being proximal to each other by not more than the prescribed spacing, to zero.

The processing described above is performed for all the main pattern features. Then, as shown in FIG. 16A, around each of the main pattern features a11-a16, the assist pattern feature arrangement regions B1-B4 corresponding to the pitches from the main pattern feature to other main pattern features are set. Further as shown in FIG. 16B, in the assist pattern feature arrangement regions B1-B4, the corresponding assist pattern features b1-b4 are disposed, respectively.

As shown in FIG. 16A, the assist pattern feature arrangement regions B2 identical to each other are set as an example in the region where the assist pattern feature arrangement region B2 corresponding to the main pattern feature a12 and the assist pattern feature arrangement region B2 corresponding to the main pattern feature a13 face each other, between the main pattern feature a12 and the main pattern feature a13. However, assist pattern feature arrangement regions different from each other may be set in the region.

For example, if the assist pattern feature arrangement region B1 and the assist pattern feature arrangement region B3 can be ensured between the main pattern feature a12 and the main pattern feature a13 without mutually overlaying, the assist pattern feature arrangement region B1 and the assist pattern feature arrangement region B3 may be set between those main pattern features a12 and a13. If the assist pattern feature arrangement region B1 and the assist pattern feature arrangement region B3 can be ensured without mutually overlaying, also the assist pattern feature b1 and the assist pattern feature b3 disposed in the respective regions do not mutually overlay nor are too proximal to each other.

If the mutually faced assist pattern feature arrangement regions corresponding to different main pattern features are set identical to each other in the region where the assist pattern feature arrangement regions face each other as shown in FIG. 16A, the assist pattern feature arrangement processing can be performed more quickly in a short time. The assist pattern feature arrangement region is set appropriately according to the pitch between the adjacent main pattern features. Therefore, it is preferable to dispose the assist pattern feature arrangement region set in accordance with the pitch from the perspective of ensuring the margin, avoiding the risk of transfer of the assist pattern feature, avoiding the violation against mask constraint conditions, and the like, rather than to dispose an assist pattern feature arrangement region different from the one appropriately set.

Upon completing the processing for all the main pattern features and obtaining a conclusion of "Yes" in the step 306 in FIG. 14, the arrangement processing of the assist pattern feature is completed (step 307).

According to the embodiment described above, the position and the size of the plurality of assist pattern features falling under the same group added to one main pattern feature are set appropriately for each individual assist pattern feature according to the size of the region in which the assist pattern feature is disposed, instead of being set evenly in the group. Thereby, particularly for a main pattern feature located in an end region and not surrounded by other main pattern features, the margin improvement effects due to the assist pattern features disposed on the side of the region in which the other main pattern features do not exist can be enhanced.

Generally, in design rules of contact holes, minimum spaces allowing the arrangement are equal between in two orthogonal directions (assuming that these directions are an X direction and a Y direction). Therefore, at the time of setting the assist pattern feature arrangement region described above, the regions created by quartering the square with equal sides in the X and Y directions are regarded as the assist pattern feature arrangement regions. However, in the case of a contact hole pattern in which minimum spaces allowing the arrangement are different between in the X and Y directions or arrangement pitches being different between in the X and Y directions, a rectangle corresponding thereto may be created and then it is quartered to regard the quartered one as the assist pattern feature arrangement region.

Figure 18A:
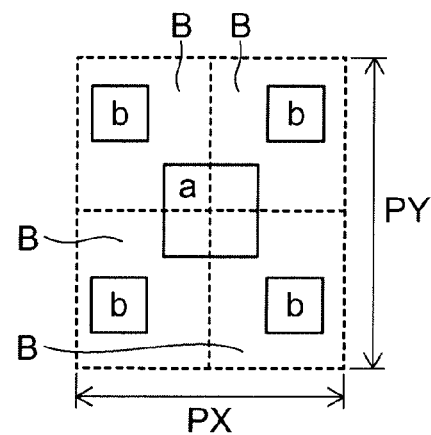
FIGS. 18A to 18D are schematic views of modified examples of the assist pattern feature arrangement region and the assist pattern feature disposed in each assist pattern feature arrangement region.

For example, in the example shown in FIG. 18A, a pitch PY between main pattern features a in the Y direction is greater than a pitch PX between the main pattern features a in the X direction. A rectangle longer in the Y direction with respect to in the X direction is created. Then, the rectangle is divided into four equal rectangular regions to regard the resulting regions as the assist pattern feature arrangement regions B.

Figure 18B:
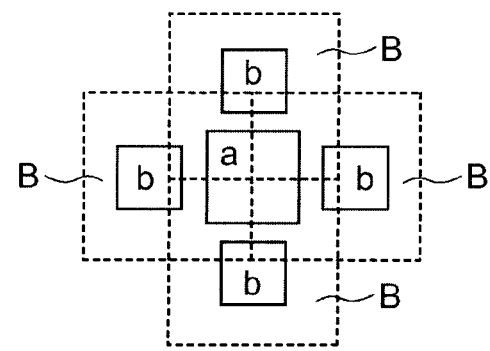

Further, as shown in FIG. 18B, in a layout in which an assist pattern feature b is disposed in the area opposed to each side of the tetragon-shaped main pattern feature a, there may be cases where the assist pattern feature arrangement regions B indicated by the broken lines mutually overlay. It is allowable that the assist pattern feature arrangement regions B added to the same main pattern feature a and falling under the same group mutually overlay. Mutual overlaying of the assist pattern feature arrangement regions falling under different groups violates the design rule as described above.

Figure 18C:
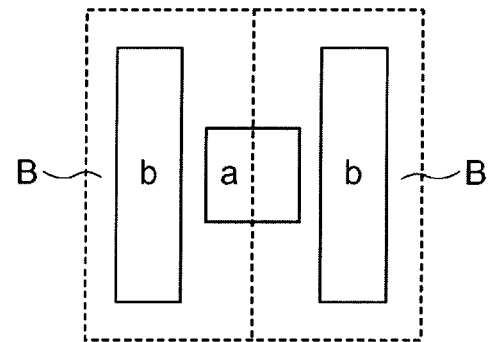
Figure 18D:
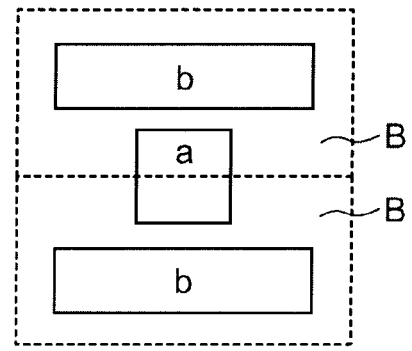

Moreover, in a layout in which the assist pattern features b are disposed only beside the main pattern feature a as shown in FIG. 18C, or only above and below the main pattern feature a as shown in FIG. 18D, the assist pattern feature arrangement region B is set by bisecting the square or rectangle (indicated by the broken lines) of which the lengths of sides are determined according to the pitch.

A method for manufacturing a semiconductor device using the mask according to the embodiment of the present invention described above will now be described. For example, manufacturing steps are illustrated for a MOSFET (Metal-Oxide-Semiconductor Field Effect Transistor) used as the semiconductor device.

During the manufacture of a MOSFET, first, a gate insulation film is formed above, for example, a silicon substrate and/or a silicon layer (hereinbelow referred to collectively as "wafer"). Then, a conductive layer that forms a gate electrode is formed above the gate insulation film. Thereafter, the conductive layer and the gate insulation film are patterned. The mask according to this embodiment described above can be used in the patterning step.

In other words, after creating the mask as described above (step 201 of FIG. 12), the patterns are exposed and transferred onto a resist formed on the films to be fashioned on the wafer using the mask recited above (step 202 of FIG. 12). At this time, only the main pattern features are transferred, and the assist pattern features having sizes below the resolution limit are not transferred.

Figure 12:
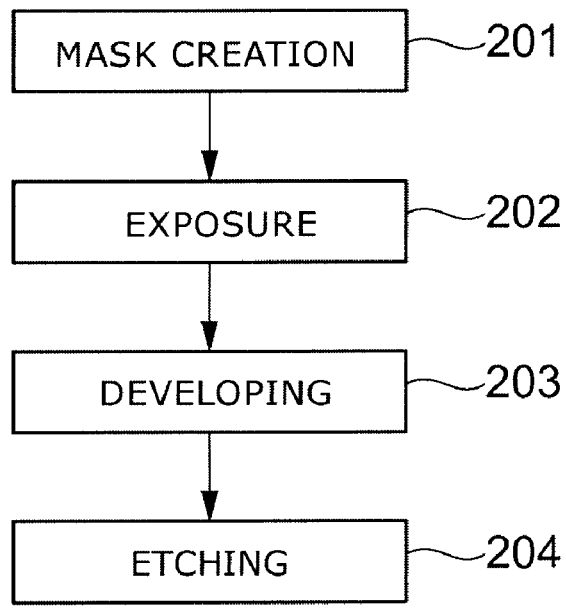
FIG. 12 is a flowchart showing patterning steps using a mask in the manufacturing method of a semiconductor device according to the embodiment of the present invention.

Then, after developing the resist (step 203 of FIG. 12), the films to be fashioned are etched using the resist as a mask (step 204 of FIG. 12). Thereby, the main pattern features are formed in the films to be fashioned.

Continuing, impurities are introduced into the wafer using the patterned gate as a mask, and source/drain regions are thereby formed. Then, an inter-layer insulative film is formed on the wafer and a circuitry layer is formed, and the main components of the MOSFET are thereby completed. Here, the exposure and transfer of patterns using the mask recited above can be utilized also in a step to form vias in the inter-layer insulative film to provide contacts between the circuitry layer and the source/drain region.

Hereinabove, the embodiment of the present invention is described with reference to specific examples. However, the present invention is not limited thereto, and various modifications are possible based on the technical spirit of the present invention.

Each of the layout, size, configuration, pitch classification method, etc., of the main pattern features and the assist pattern features illustrated in the embodiment described above is but one example, and the present invention is not limited thereto. Although the embodiment described above illustrates a specific example in which the assist pattern features b are disposed upward, downward, leftward, and rightward from the main pattern feature a to dispose the centers of the assist pattern features b on two orthogonal straight lines (FIG. 7B) and a specific example in which the assist pattern features b are disposed in diagonal directions between the two orthogonal straight lines (opposite-angle positions of the main pattern feature a) (FIG. 6B), each of these specific examples is but one example, and the positional arrangement of the assist pattern features b is not limited thereto. For example, assist pattern features may be disposed such that the centers of the assist pattern features are disposed between the two orthogonal straight lines and the opposite-angle positions recited above.

Further, the present invention is applicable in the case where a dipole illumination is used as the off-axis modified illumination. The dipole illumination includes light emitting regions of only the two light emitting regions 31 and 32 or only the two light emitting regions 33 and 34 of the quadrupole illumination illustrated in FIG. 4; and the reasoning concerning σin and σout is similar to that of the quadrupole illumination.

Furthermore, the pattern transfer using the mask of the present invention is not limited to a semiconductor wafer process, and is applicable to a pattern transfer to a glass substrate of a display, a printed circuit board, an interposer, and the like.

The invention claimed is:

1. A mask pattern data creation method for creating assist pattern feature data of a plurality of assist pattern features to be formed on a mask along with a plurality of main pattern features transferrable to a transfer destination by an exposure, the assist pattern features being not transferrable to the transfer destination, the method comprising:
   classifying the main pattern features into at least two groups in accordance with a minimum pitch between adjacent main pattern features;
   determining, for a group having a smallest minimum pitch, whether a spacing between adjacent assist pattern features corresponding to main pattern features in the group is not more than a prescribed spacing, the determination being performed based on:
      initial positions of the adjacent assist pattern features determined based on an illumination condition; and
      initial sizes of the adjacent assist pattern features satisfying a size condition such that the adjacent assist pattern features are not transferrable to the transfer destination; and
   adjusting, when it is determined that the spacing between the adjacent assist pattern features is not more than the prescribed spacing, at least one of the adjacent assist pattern features by at least one of changing its position or reducing its size, so as to increase the spacing between the adjacent assist pattern features to exceed the prescribed spacing.

2. The method according to claim 1, wherein, in the case where the assist pattern features disposed at the initial positions overlay each other, the at least one of the assist pattern features is moved from its initial position toward a center of the corresponding main pattern feature to prevent the assist pattern features from overlaying each other, and subsequently, the size of the moved assist pattern feature is increased.

3. The method according to claim 1, wherein the position of the at least one of the assist pattern features is modified according to a pitch between adjacent main pattern features.

4. The method according to claim 1, wherein the size of the at least one of the assist pattern features is modified according to a pitch between adjacent main pattern features.

5. The method according to claim 1, wherein the illumination condition is an off-axis illumination condition.

6. The method according to claim 5, wherein the off-axis illumination condition includes a wavelength λ of illumination light, a numerical aperture NA of a projection lens through which the illumination light passes, and an inside radius and an outside radius of a light emitting region in a coordinate system in which a radius of a pupil of the projection lens is standardized at unity.

7. The method according to claim 1, wherein the assist pattern features are disposed upward, downward, leftward, and rightward from the main pattern feature to dispose centers of the assist pattern features on two orthogonal straight lines.

8. The method according to claim 1, wherein the assist pattern features are disposed at four corners of the main pattern feature.

9. The method according to claim 1, wherein the assist pattern features are disposed in regions between four corners of the main pattern feature and two orthogonal straight lines not passing through the four corners.

10. A mask pattern data creation method for creating assist pattern feature data of a plurality of assist pattern features to be formed on a mask along with a plurality of main pattern features transferrable to a transfer destination by an exposure, the assist pattern features being not transferrable to the transfer destination, the method comprising:

classifying the main pattern features into at least two groups in accordance with a minimum pitch between adjacent main pattern features;

setting assist pattern feature arrangement regions for at least one of the adjacent main pattern features, according to the minimum pitch between the adjacent main pattern features; and setting positions and sizes of the assist pattern features associated with the assist pattern feature arrangement regions so that a spacing between adjacent assist pattern features is more than a prescribed spacing.

11. The method according to claim 2, wherein a group composed of a plurality of the assist pattern features is disposed for the one main pattern feature and a position and a size of all the assist pattern features falling under the same group are set to a position and a size established according to a spacing between a target main pattern feature to which assist pattern features falling under the group are disposed and another main pattern feature most proximal to the target main pattern feature.

12. The method according to claim 2, wherein a group composed of a plurality of the assist pattern features is disposed for the one main pattern feature and a position and a size of each individual assist pattern feature are set for each individual assist pattern feature according to a spacing of the main pattern features, independently of a position and a size of another assist pattern feature falling under the same group.

13. The method according to claim 10, wherein the assist pattern features are disposed upward, downward, leftward, and rightward from the main pattern feature to dispose centers of the assist pattern features on two orthogonal straight lines.

14. The method according to claim 10, wherein the assist pattern features are disposed at four corners of the main pattern feature.

15. The method according to claim 10, wherein the assist pattern features are disposed in regions between four corners of the main pattern feature and two orthogonal straight lines not passing through the four corners.

* * * * *

UNITED STATES PATENT AND TRADEMARK OFFICE
CERTIFICATE OF CORRECTION

PATENT NO. : 7,998,642 B2  Page 1 of 1
APPLICATION NO. : 12/478479
DATED : August 16, 2011
INVENTOR(S) : Kodama et al.

It is certified that error appears in the above-identified patent and that said Letters Patent is hereby corrected as shown below:

Claim 6, column 18, lines 61-62, change "region in a coordinate system" to --region in a σ coordinate system--.

Signed and Sealed this
Twenty-ninth Day of November, 2011

David J. Kappos
*Director of the United States Patent and Trademark Office*